United States Patent [19]

Matsushita et al.

[11] Patent Number: 5,192,989
[45] Date of Patent: Mar. 9, 1993

[54] LATERAL DMOS FET DEVICE WITH REDUCED ON RESISTANCE

[75] Inventors: Tsutomu Matsushita; Teruyoshi Mihara; Masakatsu Hoshi; Kenji Yao, all of Yokohama, Japan

[73] Assignee: Nissan Motor Co., Ltd., Yokohama, Japan

[21] Appl. No.: 618,358

[22] Filed: Nov. 27, 1990

[30] Foreign Application Priority Data

Nov. 28, 1989 [JP] Japan ............................. 1-306444
Mar. 8, 1990 [JP] Japan ............................. 2-57578

[51] Int. Cl.$^5$ ............................................. H01L 29/78
[52] U.S. Cl. ..................................... 257/342; 257/338; 257/343; 257/401; 257/750
[58] Field of Search ................. 357/23.4, 38, 41, 42

[56] References Cited

U.S. PATENT DOCUMENTS

| | | | |
|---|---|---|---|
| 4,148,047 | 4/1979 | Hendrickson | 357/45 |
| 4,794,432 | 12/1988 | Yilmaz et al. | 357/23.4 |
| 4,890,142 | 12/1989 | Tonnel et al. | 357/23.4 |
| 4,901,131 | 2/1990 | Takahashi | 357/23.4 |
| 4,920,397 | 4/1990 | Ishijima | 357/23.4 |
| 4,982,249 | 1/1991 | Kim et al. | 357/23.4 |
| 4,998,156 | 3/1991 | Goodman et al. | 357/23.4 |

FOREIGN PATENT DOCUMENTS

| | | | |
|---|---|---|---|
| 61-159767 | 7/1986 | Japan | 357/23.4 |
| 62-217664 | 9/1987 | Japan | 357/23.4 |
| 63-194367 | 8/1988 | Japan | 357/23.4 |
| 1-189175 | 7/1989 | Japan | 357/23.4 |
| 1-191477 | 8/1989 | Japan | 357/23.4 |
| 2-102580 | 4/1990 | Japan | 357/23.4 |

OTHER PUBLICATIONS

Electronic Engineering, Feb. 1983, "Siliconix undercuts power Mosfet Industry", page 15.

Primary Examiner—Rolf Hille
Assistant Examiner—Steven Loke
Attorney, Agent, or Firm—Foley & Lardner

[57] ABSTRACT

A lateral DMOS FET device which has a small on resistance. The device includes a cell structure formed by a plurality of unit cells, each unit cell including: a source region of first conduction type formed on one side of a substrate of first conduction type; a channel region of second conduction type formed around the source region; and a plurality of drain contact regions of first conduction type located around the channel region; and a source electrode, a gate electrode, and a drain electrode, all of which are formed on the same one side of the substrate. Alternatively, each unit cell may includes: a drain contact region of first conduction type formed on one side of a substrate of first conduction type; a channel region of second conduction type formed around the drain contact region; and a plurality of source regions of first conduction type located around the channel region.

22 Claims, 16 Drawing Sheets

LATERAL DMOS FET DEVICE WITH REDUCED ON RESISTANCE

BACKGROUND OF THE INVENTION

1. Field of the Invention

The present invention relates to a type of a MOSFET device called lateral DMOS FET device.

2. Description of the Background Art

There are two types of a conventional power DMOS-FET device, including a vertical DMOSFET (VDMOS) which has a drain electrode on a back side of a substrate, and a lateral DMOSFET (LDMOS) which has a drain electrode formed on a top side of a substrate.

Now, an example of a conventional n-channel type VDMOS shown in FIG. 1 will be described.

In this n-channel type VDMOS, an n+-type diffusion layer 4 is formed inside a p-type diffusion layer 3, which is formed inside an n-type epitaxial layer 2 formed on an n+-type silicon substrate 12. Also, on a top side of the n-type epitaxial layer 2, a gate electrode 7 is formed on a gate insulation film 6 formed over the p-type diffusion layer 3 functioning as a channel region and the n+-type diffusion layer 4 functioning as a source region. The gate electrode 7 is covered by an interlayer insulation film 8, over which a source electrode 16 is formed. In addition, on a back side of the n+-type silicon substrate 12 which functions as a drain region, there is formed a drain electrode 13.

In such a VDMOS, the source electrode 16 and the drain electrode 13, which are main passages for the current, are separately provided on the top and back sides of the substrate 12, so that there is no need to collect the current planewise. As a result, the resistance and the area loss due to these components are reduced such that there has been an advantage that the on resistance can be lowered considerably.

However, such a VDMOS has been associated with the following problems.

First, because the drain region is formed by the n+-type silicon substrate 12, it has been difficult to form a plurality of VDMOSs on a single substrate, and operating each of them independently, or to form a VDMOS along with other devices such as a CMOS or a bipolar IC.

Secondly, the on resistance is parasitically introduced into the substrate resistance in such a VDMOS.

It has recently become popular in the VDMOS to reduce the on resistance by using finer p-type diffusion layer 3 and n+-type diffusion layer 4 manufactured by the improved fine manufacturing technique. There is a device of less than 100 V voltage capacity, which has the on resistance of less than 1 mΩ·cm². Such a device is disclosed by Krishina Shenai et al. in "Blanket LPCVD tungusten Silicide technology for Smart Power Applications", IEEE EDL Vol. 10, No. 5, June 1989.

However, when the finer manufacturing is used, although the channel resistance can be reduced, the resistance of the substrate which makes up the majority of the chip thickness becomes unignorable. Namely, the on resistance $R_{on}$ can be expressed in terms of the channel resistance $R_{ch}$, accumulation resistance $R_{ac}$, epitaxial layer spreading resistance $R_{epi}$, and substrate resistance $R_{sub}$ as:

$$R_{on} = R_{ch} + R_{ac} + R_{epi} + R_{sub} \quad (1)$$

This implies that the substrate resistance $R_{sub}$ becomes 30–40% of the entire on resistance $R_{on}$ for a cell size of 10×10 μm, using a gate oxide film thickness=500 Å, a gate effective voltage=15 V, an epitaxial layer specific resistance=0.4 Ω·cm, an epitaxial layer thickness=6.5 μm, a substrate specific resistance=0.04 Ω·cm, and a substrate thickness=380 μm.

The substrate resistance can be reduced by increasing the impurity density or by thinning the substrate thickness, but the former has a problem that the deterioration of the crystallization property of the epitaxial layer can also be caused, while the latter has a problem of a wafer cracking due to the reduced mechanical strength. Thus, there is a limit to an extent that the on resistance can be reduced.

On the other hand, an example of one type of a conventional n-channel type LDMOS is shown in FIG. 2, which will now be described.

In this n-channel type LDMOS, an n+-type diffusion layer 4 is formed inside a p-type diffusion layer 3, which is formed inside an n-type epitaxial layer 2 formed on a p-type silicon substrate 1. Also, on a top side of the n-type epitaxial layer 2, a gate electrode 7 is formed on a gate insulation film 6 formed over the p-type diffusion layer 3 functioning as a channel region and the n+-type diffusion layer 4 functioning as a source region. The gate electrode 7 is covered by an interlayer insulation film 8, over which a source electrode 16 is formed. In addition, there is provided an n-type diffusion layer 15 which is making a contact with an n+-type buried layer 14 formed between the p-type silicon substrate 1 and the n-type epitaxial layer 2, and an n+-type diffusion layer 5 is formed inside the n-type diffusion layer 15, such that a drain electrode 17 can be formed over the n+-type diffusion layer 5 on a top side of the p-type silicon substrate 1.

In such an LDMOS, because it is entirely formed on the grounded p-type silicon layer 1, there has been advantages that such an LDMOS can be formed along with the other electrically isolated devices or LDMOSs, and the effect of the substrate resistance on the on resistance is very small.

However, there has also been a problem that the device area have to be enlarged in order to incorporate the n-type diffusion layer 15 and the drain electrode 17. The area required for this reason needs to be as large as that covered by the source electrode, in order to have the drain current flow.

In this type of LDMOS, the source electrode 16 and the drain electrode 17 are arranged as shown in FIG. 3. As shown, the source electrode 16 and the drain electrode 17 are shaped in comblike shapes and are arranged to be gearing with each other, in contrast to the case of VDMOS in which these components are formed over the entire front and back sides. These source and drain electrodes 16 and 17 are also shaped such that their width becomes wider toward positions of bonding pads 18 and 19. The width in a vicinity of the bonding pads 18 and 19 have to be greater for the device of larger current capacity, and therefore the dead space in the device increases as its current capacity increases.

Now, the reduction of the on resistance by using the improved fine manufacturing technique, popularly exercised for a VDMOS as already mentioned above, is not effective in reducing the dead space in the LDMOS, so that the extent by which the on resistance can be reduced has been rather limited in the LDMOS.

Also, in this type of LDMOS, there has been a problem that although the substrate resistance is very small, the parasitic drain resistance due to the resistance of n-type diffused layer and n+-type buried layer is large. This parasitic drain resistance can be reduced effectively by enlarging the total area of the n-type diffusion layer 15 so as to reduce the distance that the current have to travel through the n+-type buried layer 14. However, this in turn increases the dead space in the LDMOS.

Thus, the on resistance in this type of the LDMOS has usually been over twice as large as the VDMOS of the same device area. For this reason, the use of this type of the LDMOS has been limited to cases involving a small or medium amount of current only. For a case involving a large amount of current such as that over 10A, the device area of the LDMOS becomes practically too large.

There is also another type of an LDMOS in which the current flows along the substrate surface, which is shown in FIG. 4 and will now be described.

In this LDMOS of FIG. 4, a p-type diffusion layer 3 functioning as a channel region and an n+-type diffusion layer 5 functioning as a drain contact region are formed inside an n-type epitaxial layer 2 formed on a p-type silicon substrate 1. Inside the p-type diffusion layer 3, n+-type diffusion layer 4 functioning as a source region is formed. Also, on a top side of the p-type silicon substrate 1, a gate electrode 7 is formed on a gate insulation film 6 formed over the p-type diffusion layer 3 and the n+-type diffusion layer 4. The gate electrode 7 is covered by an interlayer insulation film 8, over which a source electrode 16 is formed. In addition, over the n+-type diffusion layer 5, a drain electrode 17 is formed on a top side of the p-type silicon substrate 1.

In such an LDMOS, just as in the LDMOS of FIG. 2 described above, because it is entirely formed on the grounded p-type silicon layer 1, there is an advantage that such an LDMOS can be formed along with the other electrically isolated devices or LDMOSSs.

Furthermore, in this type of the LDMOS, the parasitic drain resistance can be reduced as there is no n+-type buried layer 14 through which the current have to pass.

However, this type of the LDMOS is also associated with the problem of the enlargement of the device size due to the inclusion of the n+-type diffusion layer 5 and the drain electrode 17, which gives rise to the problem of the larger dead space for the larger current capacity, as in the LDMOS of FIG. 2.

In addition, because the source electrode 16 and the drain electrode 17 are in comblike shapes and also because the source region 4 and the drain connector region 5 have to be arranged adjacent to each other, the source region 4 have to be in stripe-shape which runs parallel to the comblike shape of the source electrode 16, such that the cell arrangement commonly utilized in the VDMOS has not been applicable to the LDMOS. The stripe arrangement is known to have the smaller channel width per unit area, so that there is a limit to which the on resistance can be reduced in the stripe arrangement, compared with the cell arrangement.

Thus, the on resistance in this type of the LDMOS has also usually been over twice as large as the VDMOS of the same device area.

Therefore, two types of the conventional LDMOS described so far are known to be advantageous in that they are suitable for being integrated with the other devices or made into multiple output configuration, as it has the drain electrode on the top side of the substrate, but they also have the problem of having the higher on resistance compared with the VDMOS which has the drain electrode on the back side of the substrate, such that they are less desirable in terms of costs, as well as in terms of the limit on the current capacity.

Also, in the LDMOS, since the current flows mostly on the top side of substrate, the effect of the substrate resistance becomes small. However, the device area have to be enlarged in order to incorporate the n-type diffusion layer 15 and the drain electrode 17, and the resulting increase of the wirings reduces the cell density.

As an effective cell pattern for LDMOS which can resolve the problems of the conventional LDMOS described above, a mesh-gate structure shown in FIG. 5 has been known conventionally.

In this mesh-gate structure, source openings 105 and drain openings 106 are formed by square cuttings on the gate electrode 107, and are arranged one next to another. The drain and source electrodes 113A and 116A are arranged over the source and drain openings 105 and 106 in a stripe pattern running obliquely.

On the source openings 105, the p-type channel region 103 and the n-type source region 104 are formed by using the diffusion self-align technique. On the drain openings 106, high density n-type impurities are doped in order to obtain the low Ohmic contact with the electrode.

In this mesh-gate structure, the on resistance can be reduced efficiently as the source and drain are separated in each unit cell. However, since the source openings 105 and the drain openings 106 have the same area, there is a problem in reducing the on resistance further.

Namely, the on resistance $R_{on}$ in this case can be expressed in terms of the channel resistance $R_{ch}$, accumulation resistance $R_{ac}$, epitaxial layer spreading resistance $R_{epi}$, and substrate resistance $R_{sub}$ as:

$$R_{on} = R_{ch} + \frac{1}{\frac{1}{R_{ac}} + \frac{1}{R_{epi}} + \frac{1}{R_{sub}}} \quad (2)$$

where the first term on the right hand side of the equation (2) $R_{ch}$, largely depends on the size of the source openings 105, while the second term on the right hand side largely depends on the size of the drain openings 106.

However, since the source openings 105 and the drain openings 106 have the same area, these first and second terms on the right hand side are automatically determined when the resistance of each part is determined from other conditions on the device such as the voltage capacity.

In particular, when the values of the first term and the second term are largely different, the larger one makes a dominant contribution to the on resistance, and sets the limit to an extent by which the on resistance can be reduced.

SUMMARY OF THE INVENTION

It is therefore an object of the present invention to provide an LDMOS which has a small on resistance.

According to one aspect of the present invention there is provided a lateral DMOS FET device, comprising: a cell structure formed by a plurality of unit cells, each unit cell including: a source region of first conduction type formed on one side of a substrate of first conduction type; a channel region of second conduction type formed around the source region; and a plurality of drain contact regions of first conduction type located around the channel region; a source electrode, formed on said one side of the substrate, for connecting the source region of the unit cells; a gate electrode, formed on said one side of the substrate, over the channel regions of the unit cells; a drain electrode, formed on said one side of the substrate, for connecting the drain contact regions of the unit cells.

According to another aspect of the present invention there is provided a lateral DMOS FET device, comprising: a cell structure formed by a plurality of unit cells, each unit cell including: a drain contact region of first conduction type formed on one side of a substrate of first conduction type; a channel region of second conduction type formed around the drain contact region; and a plurality of source regions of first conduction type located around the channel region; a source electrode, formed on said one side of the substrate, for connecting the source region of the unit cells; a gate electrode, formed on said one side of the substrate, over the channel regions of the unit cells; a drain electrode, formed on said one side of the substrate, for connecting the drain contact regions of the unit cells.

Other features and advantages of the present invention will become apparent from the following description taken in conjunction with the accompanying drawings.

DETAILED DESCRIPTION OF THE PREFERRED EMBODIMENTS

Now, the preferred embodiments of the present invention will be described with references to the drawings.

According to the present invention, a unit cell of an LDMOS is formed by arranging the drain contact regions on corners of a cell outer form surrounding a circular source region, and by providing a source electrode and a drain electrode in a form of a double layer structure on a surface. The cell outer form is preferably in hexagonal shape.

In this configuration, because of the use of the cell structure, the dead space and the parasitic drain resistance can be reduced compared with a case of a conventional comblike shape electrode structure.

Also, because of the use of the cell structure and the arrangement of the drain contact regions on the corners of the cell outer form, the packing density is high and the drain resistance due to the substrate resistance is very small, so that the on resistance can be small as a case of the VDMOS.

Also, by using the hexagonal or square shape for the cell outer form, the highly dense cell structure can be realized, such that the device area as well as the on resistance per unit area can be minimized.

Figure 1:
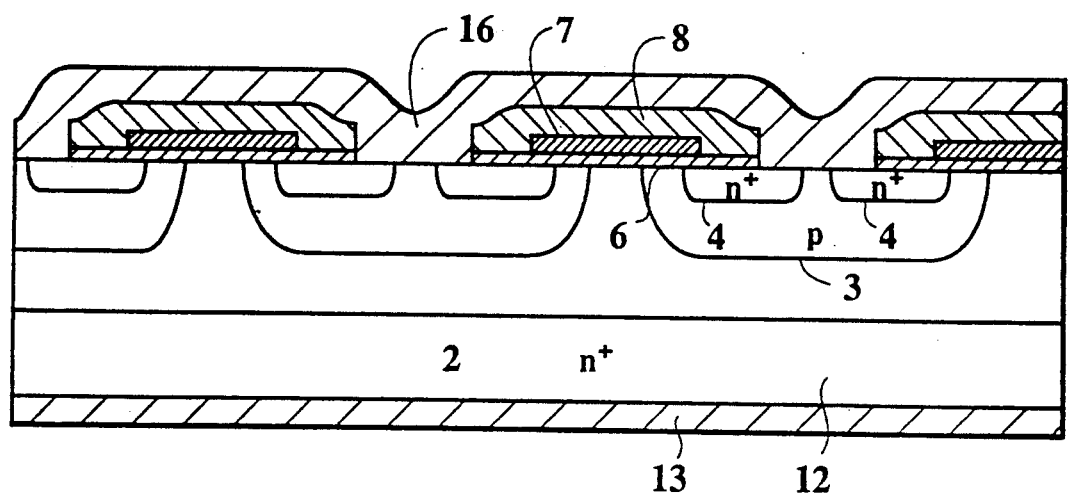
FIG. 1 is a cross sectional view of a conventional VDMOSFET device.
Figure 2:
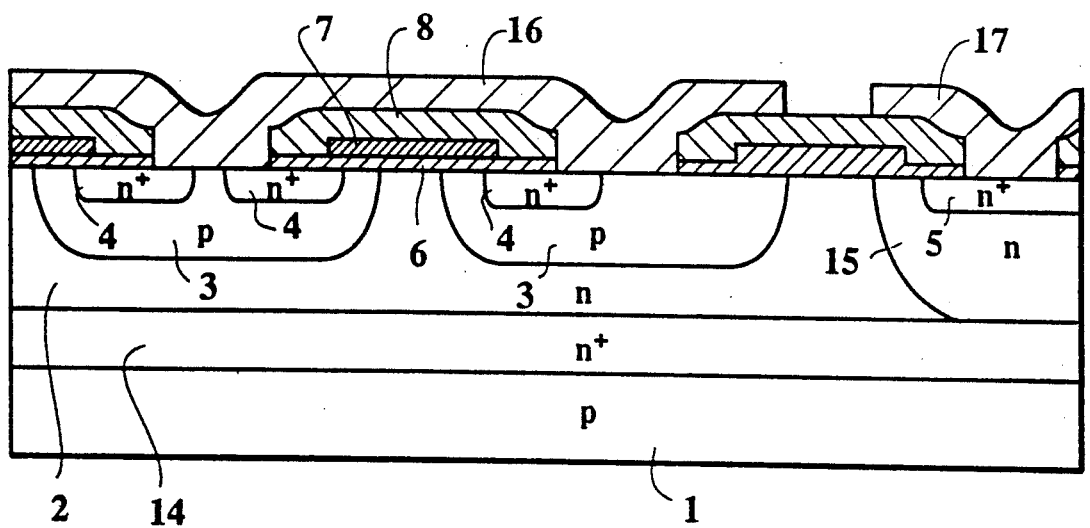
FIG. 2 is a cross sectional view of one example of a conventional LDMOSFET device.
Figure 3:
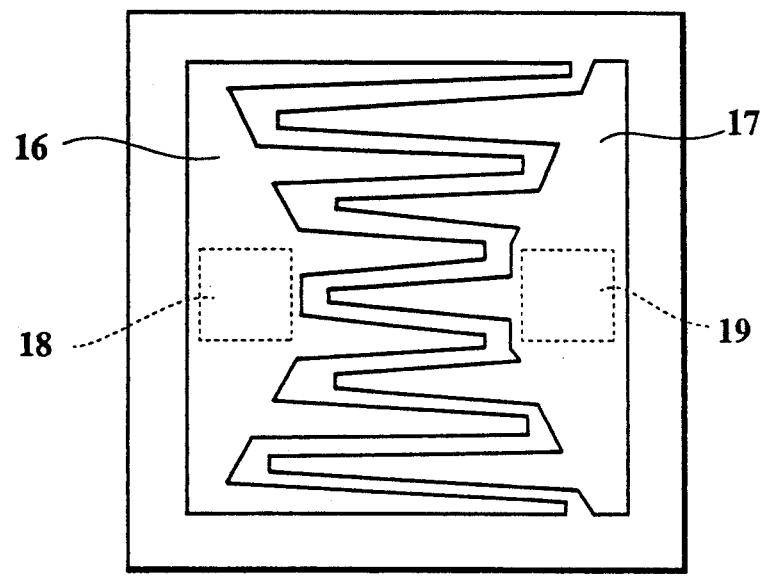
FIG. 3 is a plan view of the LDMOSFET device of FIG. 2 showing an arrangement of a source electrode and a drain electrode.
Figure 4:
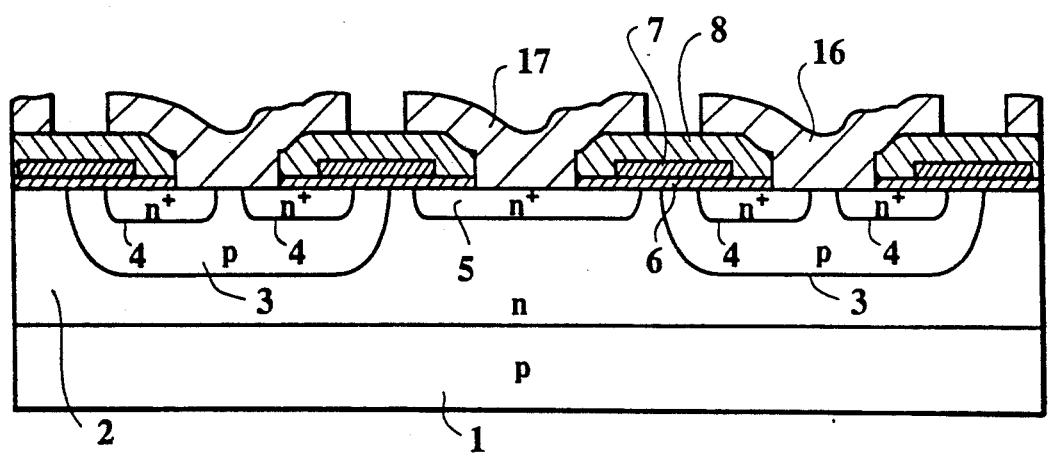
FIG. 4 is a cross sectional view of another example of a conventional LDMOSFET device.
Figure 5:
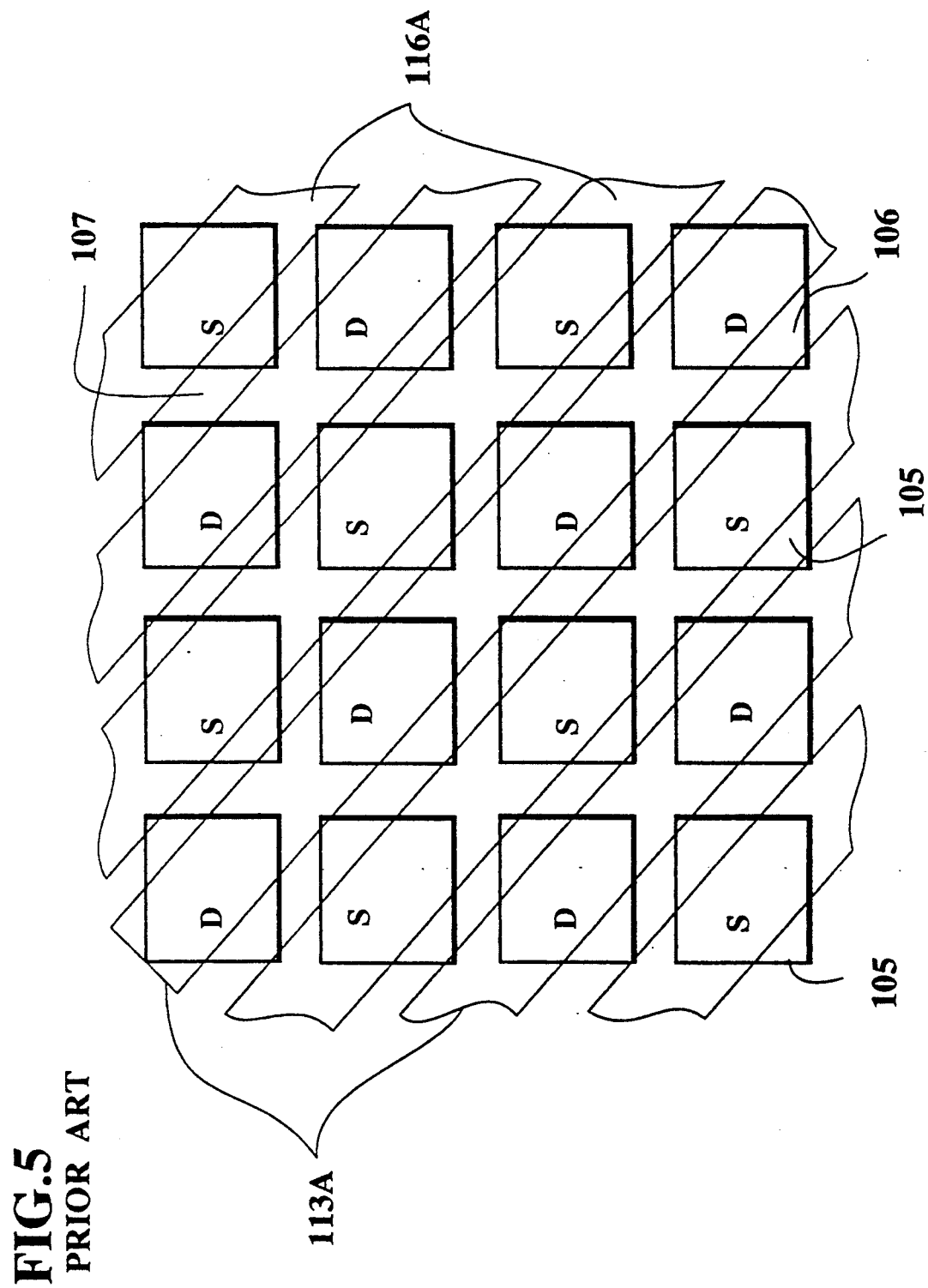
FIG. 5 is a plan view of a mesh-gate structure used in a conventional LDMOSFET device.
Figure 6:
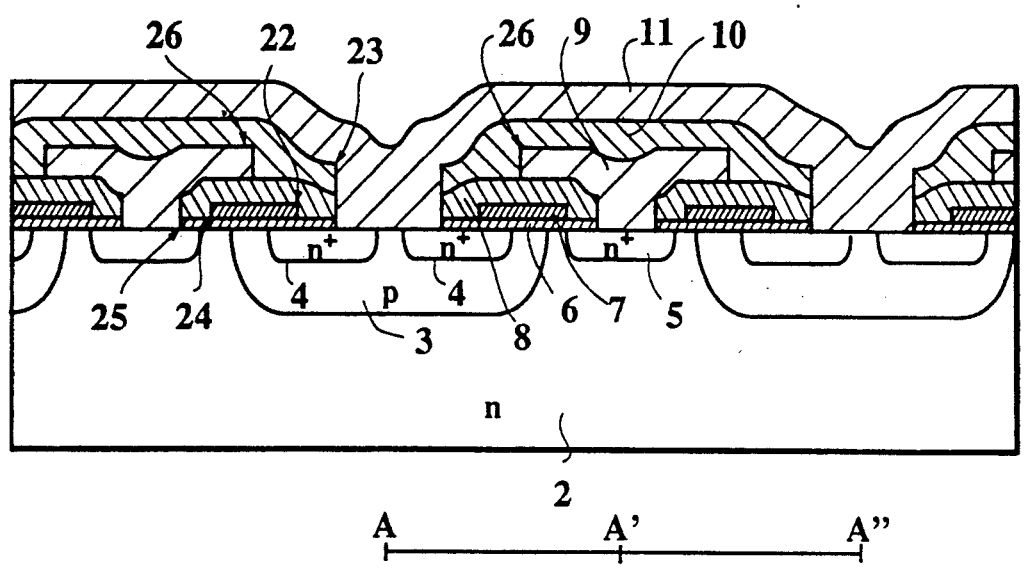
FIG. 6 is a cross sectional view of a first embodiment of a LDMOSFET device according to the present invention.
Figure 7:
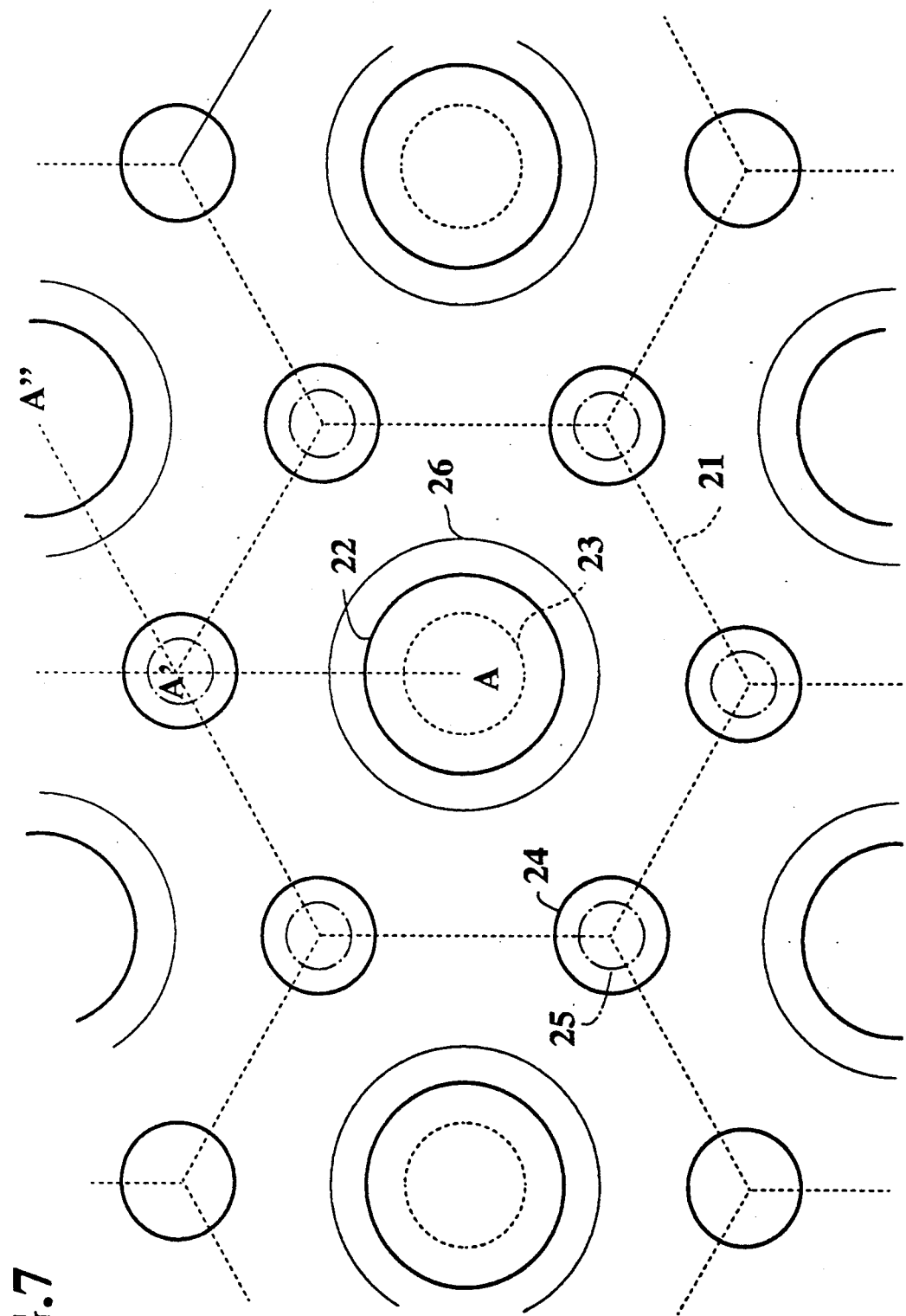
FIG. 7 is a plan view of the LDMOSFET device of FIG. 6, showing its cell structure.

Referring now to FIGS. 6 and 7, a first specific embodiment of the LDMOS device according to the present invention will be described.

As shown in FIG. 6, in this LDMOS, an $n^+$-type diffusion layer 4 is formed inside a p-type diffusion layer 3, which is formed inside an n-type epitaxial layer 2. In addition, there is provided an $n^+$-type diffusion layer 5 formed between adjacent p-type diffusion layers 3. Also, on a top side of the n-type epitaxial layer 2, a gate electrode 7 is formed on a gate insulation film 6 formed over the p-type diffusion layer 3 functioning as a channel region, the $n^+$-type diffusion layer 4 functioning as a source region, and the $n^+$-type diffusion layer 5 functioning as a drain contact region. The gate electrode 7 is covered by an interlayer insulation film 8 whose edge 25 defines a circular drain contact region. On the $n^+$-type diffusion layer 5 and the interlayer insulation film 8, there is also provided a drain electrode 9 which is covered by an interlayer insulation film 10 whose edge 23 defines a circular source contact region. Furthermore, the source contact region and the interlayer insulation film 10 are covered by a source electrode 11 common to all the unit cells 21.

This LDMOS has a so called hexagonal cell structure in which a substrate surface is divided into a plurality of hexagonal unit cells 21, as shown in FIG. 7. On a center A of each unit cell 21, a center of the source contact region is located, while on each corner A' of each unit cell 21, a center of the drain contact region is located. The edges 22 and 24 of the gate electrode 7 as well as an edge 26 of the drain electrode 9 are also in circular shapes. In FIG. 7, the source electrode 11 is not depicted.

This configuration is basically an LDMOS structure in which all of the source, drain, and gate electrodes are on a top side of the substrate, so that there is an advantage that it can be formed along with the other electrically isolated devices to form a power IC, or with other similar LDMOSs to form a multiple output device.

In addition, because it has a hexagonal cell structure, there is no dead space involved, as the unit cell is formed under the entire source and drain electrodes, unlike the case of the comblike shape electrodes, and the increase of the device area due to the incorporation of the drain contact region on the top side of the substrate is minimized. This is partly because the corners of the unit cell 21 at which the drain contact regions are located are otherwise a dead space from which the contribution to the conductance is very small, and partly because there are more than one drain contact regions involved in each unit cell 21 so that the area of each drain contact region can be as small as a half of the source contact region.

Also, because of this cell structure, it is possible to make the packing density of a channel width per unit area larger than a case of a stripe structure, and the drain contact region can be formed in a vicinity of the channel.

Moreover, because the source region is in circular shape, much more uniform electrical characteristics within a channel can be obtained, such that the device of a large avalanche capacity can be realized.

Furthermore, a resistance of the drain region directly underneath the gate electrode 7 is lowered by two to three order of magnitude as a result of the electron accumulated on the surface of the drain region, so that the drain resistance becomes quite small.

Thus, in this LDMOS, it is possible to enlarge the channel width with a small device area, such that the on resistance per unit area can be as small as the VDMOS of the same device size.

In addition, with this configuration, the source region and the drain contact region can be formed in a single manufacturing step. As for the source electrode and the drain electrode, they require two step manufacturing steps as they are in a double layer structure, but a back side electrode formation required for a VDMOS is still unnecessary.

Also, because of diffusion windows for the channel region and the source region are in circular shapes, diffusion layers of uniform electrical characteristics are realized. This property can also effectively be achieved by diffusion windows in polygonal shapes involving more than eight corners, but diffusion windows in hexagonal shapes or rectangular shapes are inadequate as the diffusion profile varies significantly between the corners and sides such that the lowering of the surge immunity in the reverse breakdown occurs.

Figure 8:
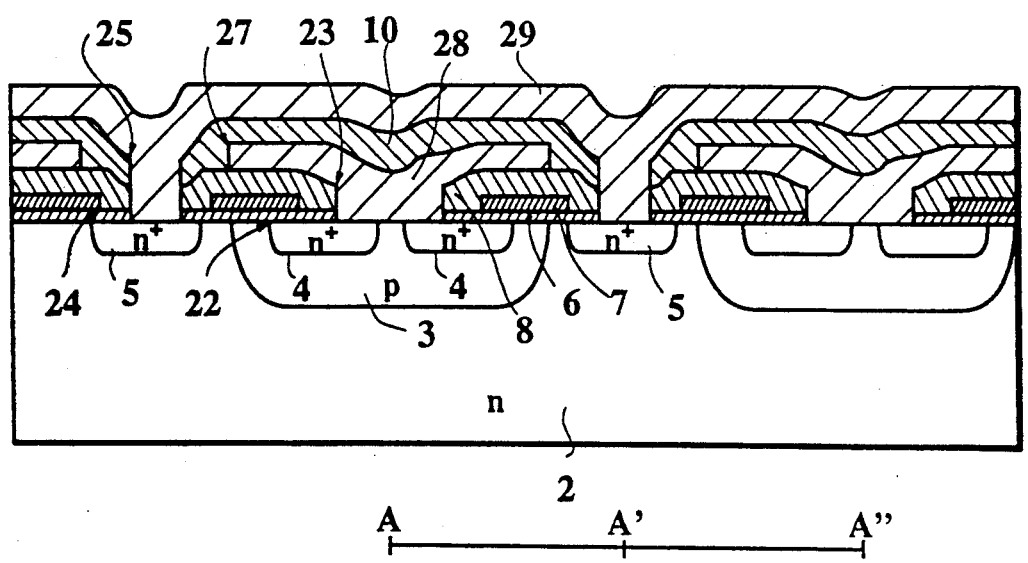
FIG. 8 is a cross sectional view of a second embodiment of a LDMOSFET device according to the present invention.
Figure 9:
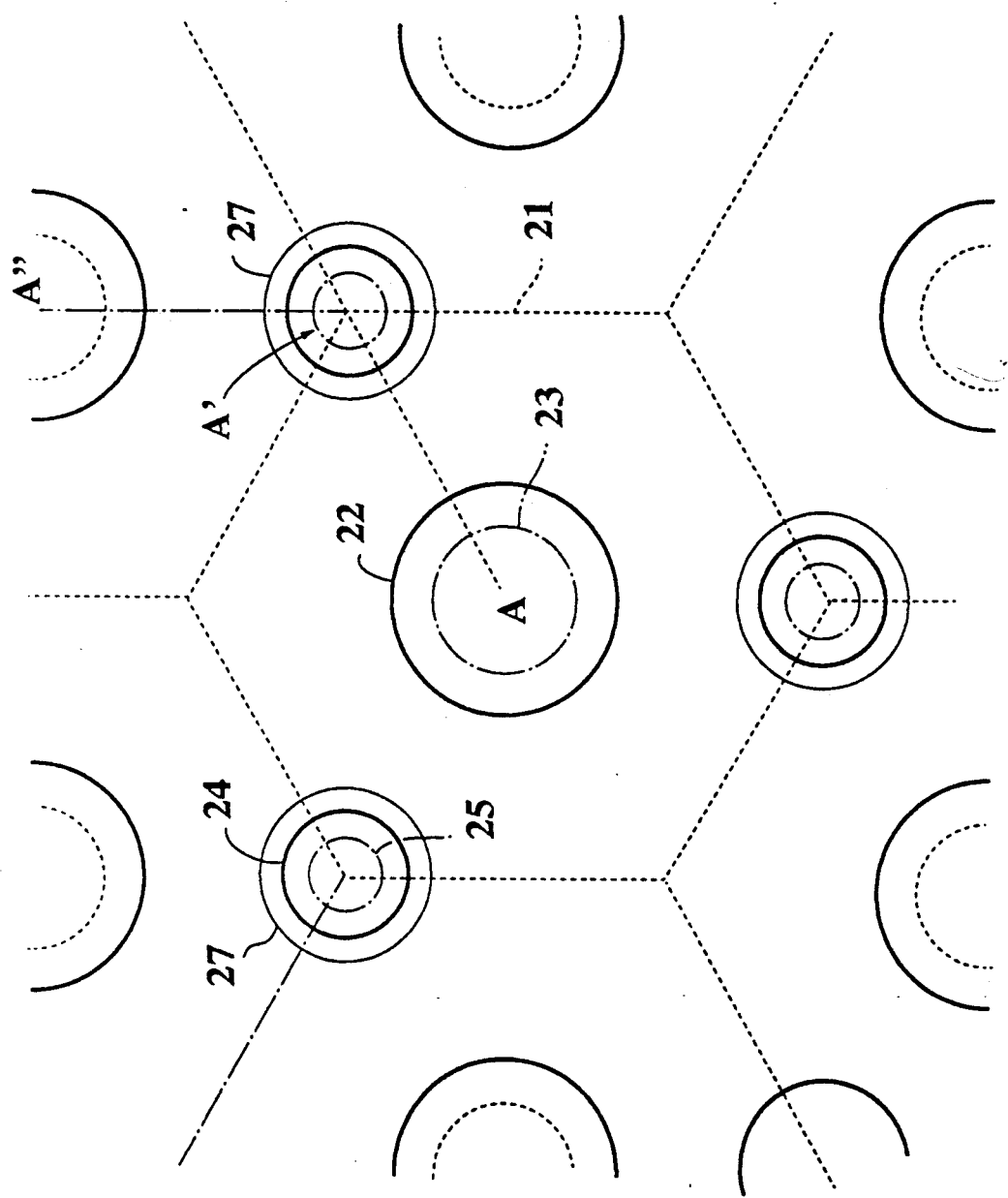
FIG. 9 is a plan view of the LDMOSFET device of FIG. 8, showing its cell structure.

Referring now to FIGS. 8 and 9, a second specific embodiment of the LDMOS device according to the present invention will be described.

This embodiment differs from the first embodiment of FIG. 6 in that, in this LDMOS of FIG. 8, an edge 23 of the interlayer insulation film 8 defines a circular source contact region, and on the n+-type diffusion layer 5 and the interlayer insulation film 8, there is provided a source electrode 28 which is covered by an interlayer insulation film 10 whose edge 25 defines a circular drain contact region. This drain contact region and the interlayer insulation film 10 are covered by a drain electrode 29 common to all the unit cells 21.

This LDMOS has a so called hexagonal cell structure in which a substrate surface is divided into a plurality of hexagonal unit cells 21, as shown in FIG. 7. On a center A of each unit cell 21, a center of the source contact region is located, while on three corner A' of each unit cell 21, a center of the drain contact region is located. The edge 27 of the source electrode 28 as well as an edge 24 of the gate electrode 7 and an edge 22 of the n+-type diffusion layer 4 are also in circular shapes. In FIG. 9, the drain electrode 29 is not depicted.

This configuration is also basically an LDMOS structure in which all of the source, drain, and gate electrodes are on a top side of the substrate, so that there is an advantage that it can be formed along with the other electrically isolated devices to form a power IC, or with other similar LDMOSs to form a multiple output device.

In addition, as in the first embodiment above, because there are more than one drain contact regions involved in each unit cell 21 so that the area of each drain contact region can be smaller than that of the source contact region, such that the parasitic drain resistance can be reduced. Here, only three drain contact regions are involved in each unit cell 21, so as not to make the total drain contact region too large compared with the source contact region.

Other advantages described above for the first embodiment are also valid for this second embodiment.

In addition, in this LDMOS, the source electrode 28 effectively functions as a field plate to weaken the electric field, so that the drain-source voltage capacity can be improved. Thus, this LDMOS is particularly suitable for high voltage application.

Figure 10:
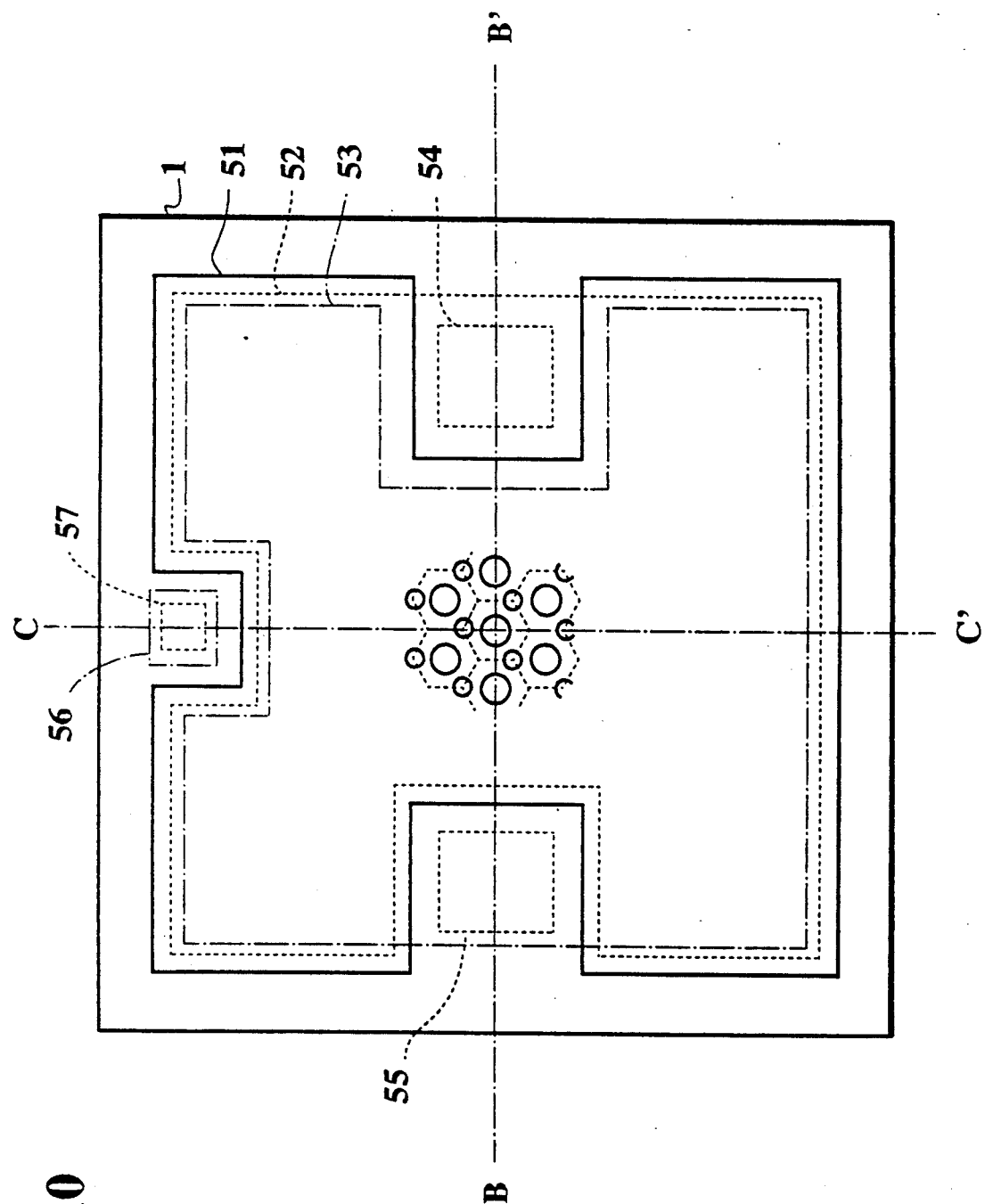
FIG. 10 is a plan view of one embodiment of a LDMOSFET chip using the LDMOSFET device of FIGS. 8 and 9.
Figure 11:
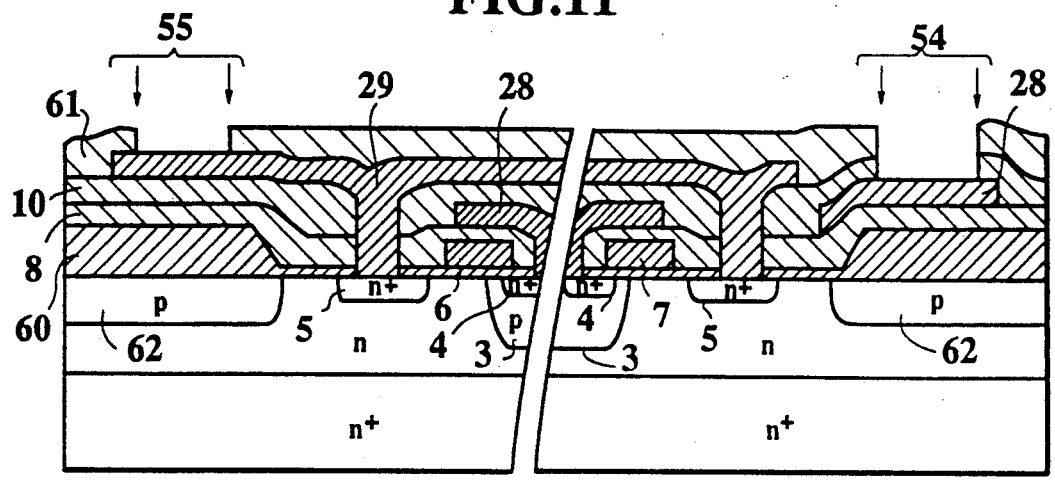
FIG. 11 is a cross sectional view of the LDMOSFET chip of FIG. 10 at B—B' plane shown in FIG. 10.
Figure 12:
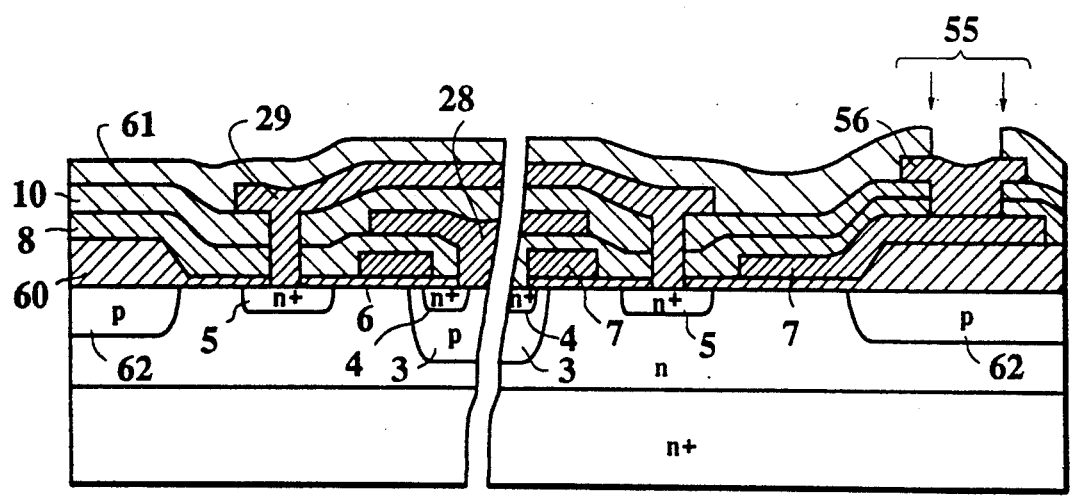
FIG. 12 is a cross sectional view of the LDMOSFET chip of FIG. 10 at C—C' plane shown in FIG. 10.

Referring now to FIGS. 10 to 12, a specific embodiment of an LDMOS chip according to the present invention which uses the LDMOS device of the second embodiment described above will be described.

In this LDMOS chip, the unit cells 21 of the LDMOS of FIG. 8 are arranged inside an outline 51 of a field oxide film 60 formed over a silicon substrate 1, and a source pad 54, drain pad 55, and a gate pad 57 are formed on the field oxide film 60. An outline 52 indicates an edge of a first aluminum layer forming the source electrode, while an outline 53 indicates an edge of a second aluminum layer forming the drain electrode.

A gate electrode 7 is formed from poly-crystalline silicon film, to which a wire bonding cannot be provided directly, so that an aluminum gate electrode 56 is formed along with the drain electrode 29 from the second aluminum layer, on top of which the gate pad 57 is placed.

In FIGS. 11 and 12, a passivation film 61 and a guard ring 62 which are omitted from FIG. 10 are also shown.

This LDMOS chip can be manufactured in a process depicted in FIGS. 13(A) to 13(P).

First, as shown in FIG. 13(A), an n-type epitaxial layer 2 to be a drain region is grown.

Next, as shown in FIG. 13(B), a photo-resist-pattern R to function as a mask is formed on the n-type epitaxial layer 2 by using a usual photo-lithographic method, and boron ions B for forming the guard ring 62 are ion-implanted.

Next, as shown in FIG. 13(C), the field oxide film 60 is formed over the n-type epitaxial layer 2.

Next, as shown in FIG. 13(D), the filed oxide film 60 on a device formation area are selectively removed.

Next, as shown in FIG. 13(E), a gate oxide film 6 are formed on the device formation area.

Next, as shown in FIG. 13(F), the gate electrode 7 made of a poly-crystalline silicon film is formed on the gate oxide film.

Next, as shown in FIG. 13(G), a photo-resist-pattern R to function as a mask is formed by using a usual photo-lithographic method, and boron ions B for forming the p-type diffusion layer 3 to be a channel region are ion-implanted.

Next, as shown in FIG. 13(H), the p-type diffusion layer 3 and the guard ring 62 are formed by a thermal diffusion.

Next, as shown in FIG. 13(I), a photo-resist-pattern R to function as a mask is formed by using a usual photo-lithographic method, and phosphorus ions P for forming the n+-type diffusion layer 4 to be a source region and the n+-type diffusion layer 5 to be a drain contact region are ion-implanted.

Next, as shown in FIG. 13(J), the interlayer insulation film 8 is formed and the n+-type diffusion layer 4 and the n+-type diffusion layer 5 are formed by a thermal diffusion.

Next, as shown in FIG. 13(K), a contact opening 23 for the source electrode 28 is formed by using a usual photo-lithographic etching method.

Next, as shown in FIG. 13(L), the first aluminum layer is deposited by using an evaporation (or sputter) method, and then the source electrode 28 is formed by using a patterning method.

Next, as shown in FIG. 13(M), the second interlayer insulation film 10 is formed.

Next, as shown in FIG. 13(N), a contact opening 25 for the drain electrode 29 as well as a contact opening (not shown) for the gate electrode 7 are formed.

Figure 13:
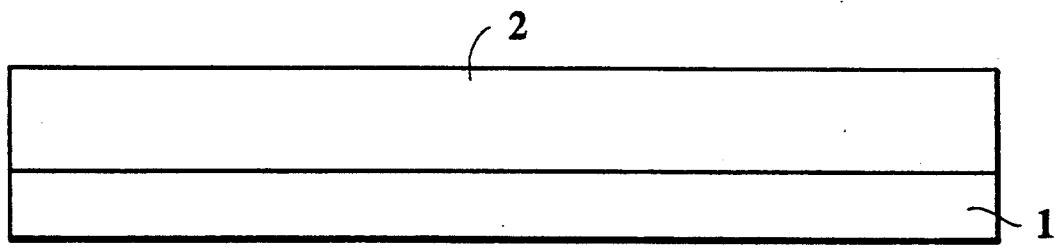
FIG. 13(A)–13(P) are sequential cross sectional views of the LDMOSFET chip of FIG. 10, showing a manufacturing process of this LDMOSFET chip.
Figure 13:
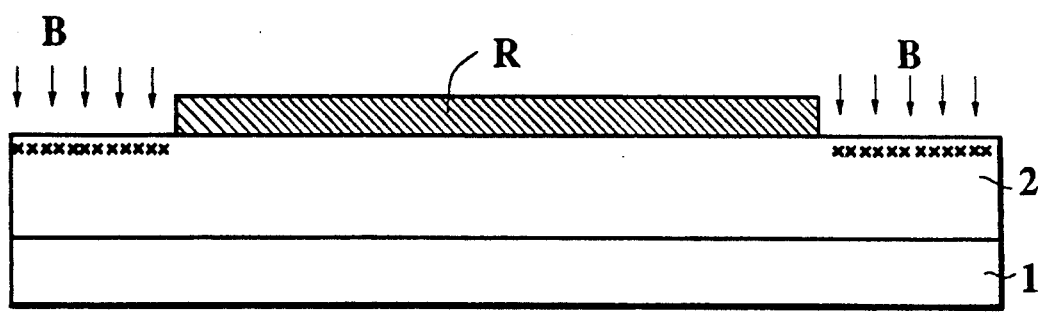
Figure 13:
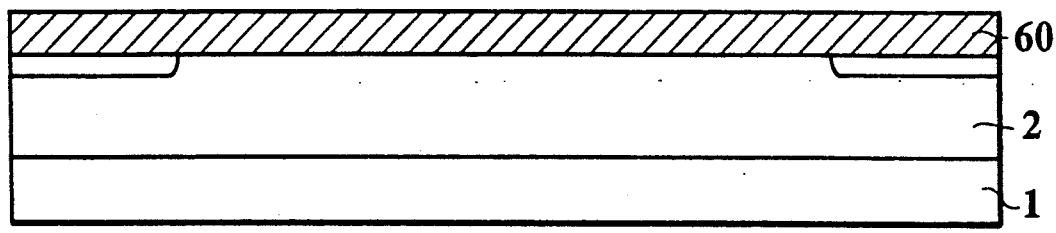
Figure 13:
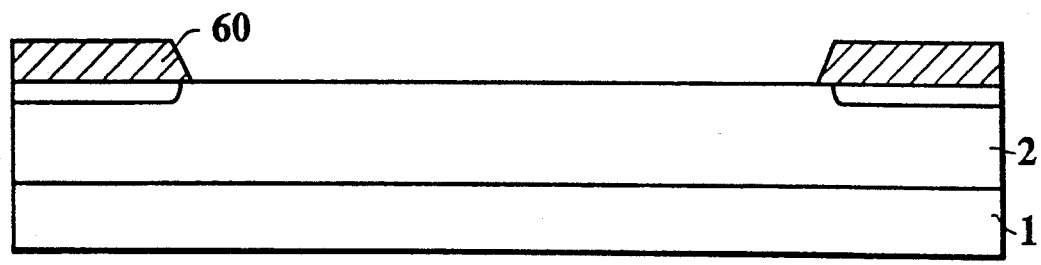
Figure 13:
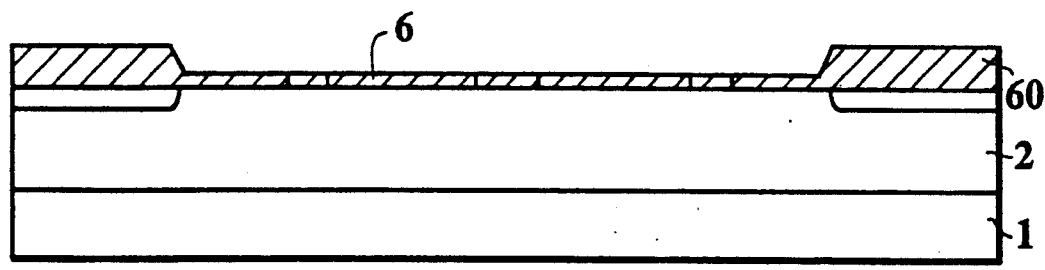
Figure 13:
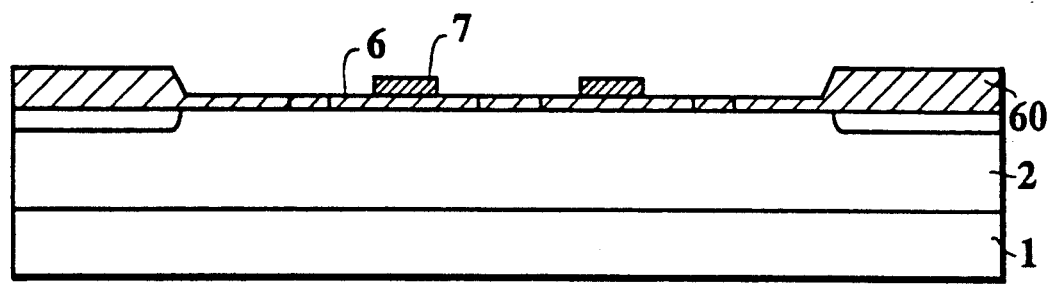
Figure 13:
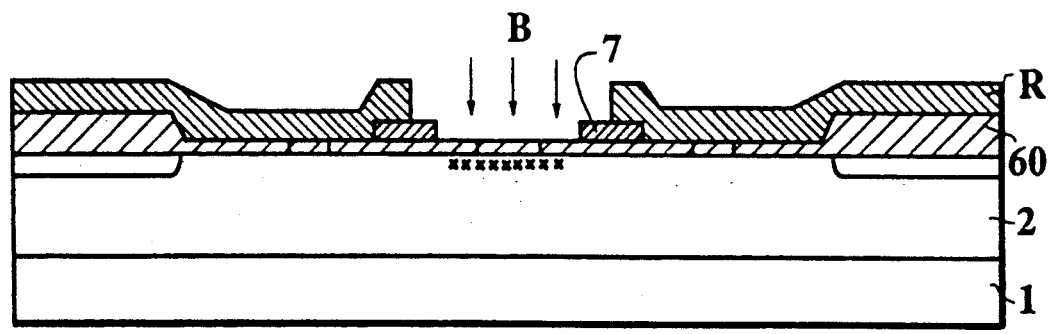
Figure 13:
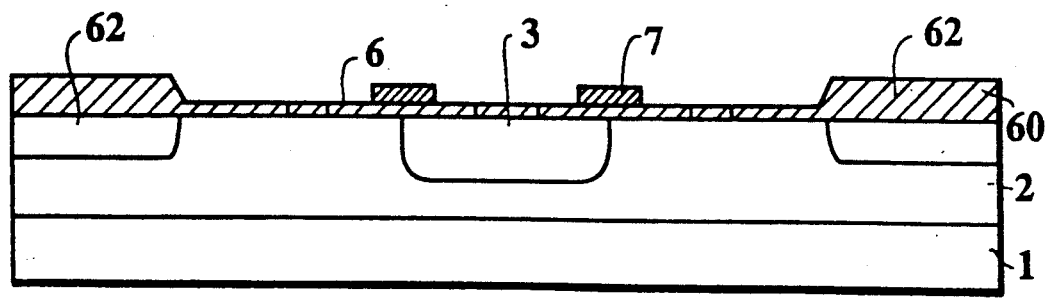
Figure 13:
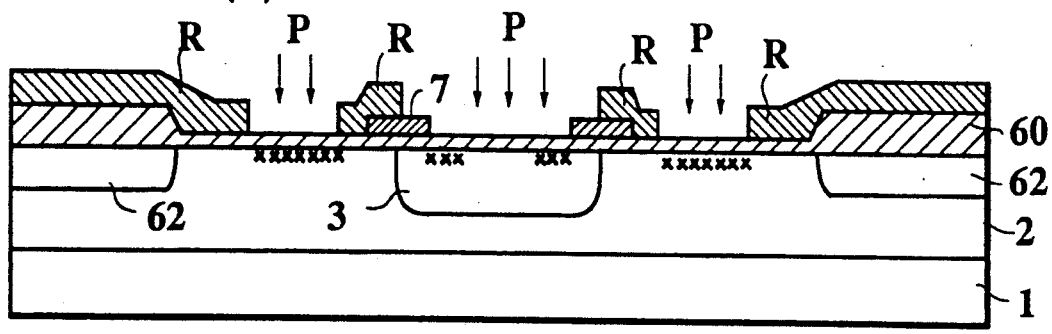
Figure 13:
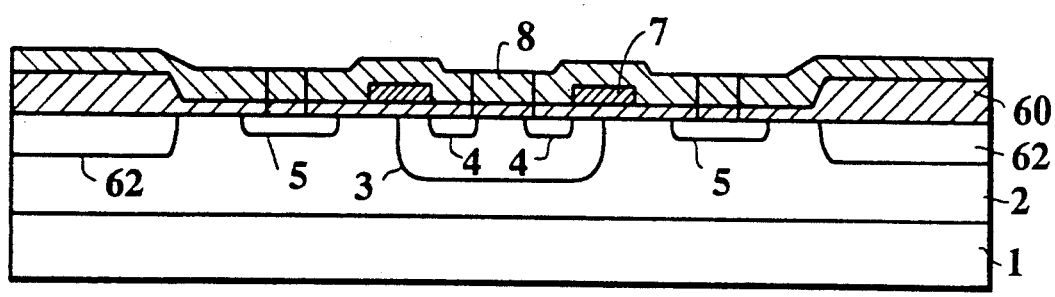
Figure 13:
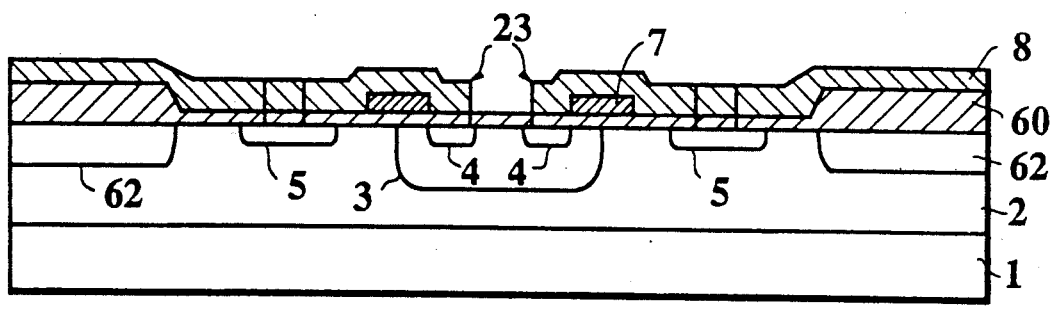
Figure 13:
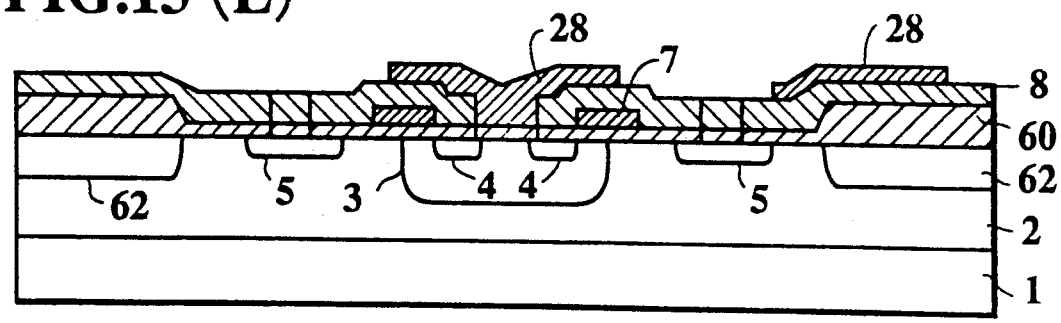
Figure 13:
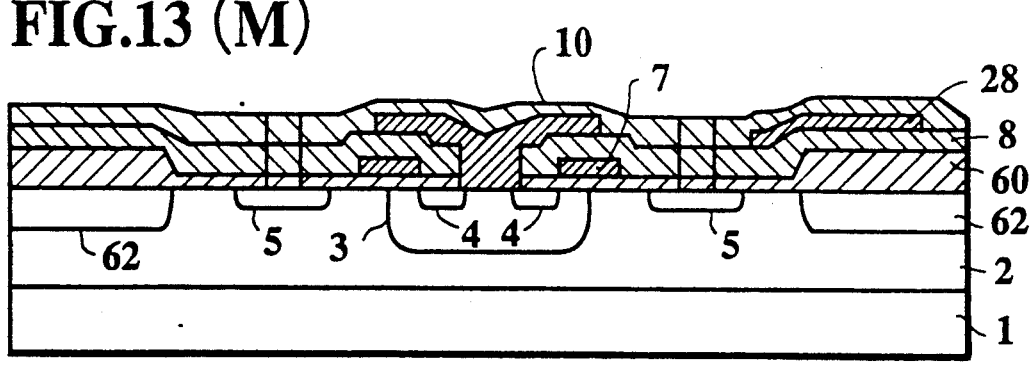
Figure 13:
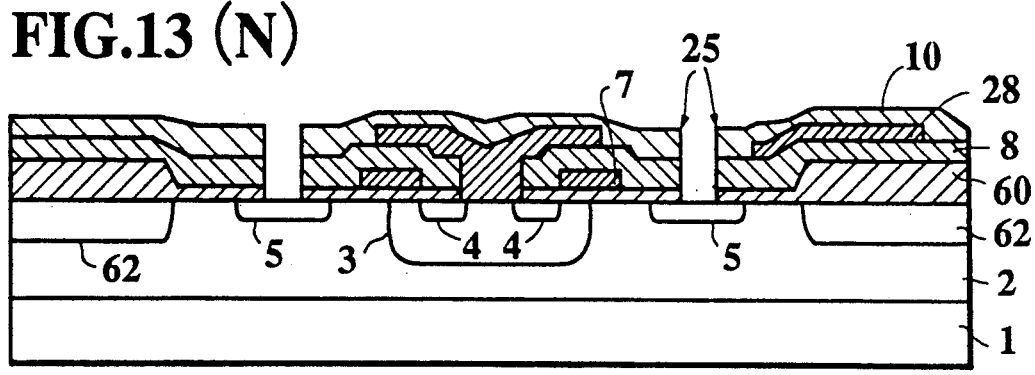
Figure 13:
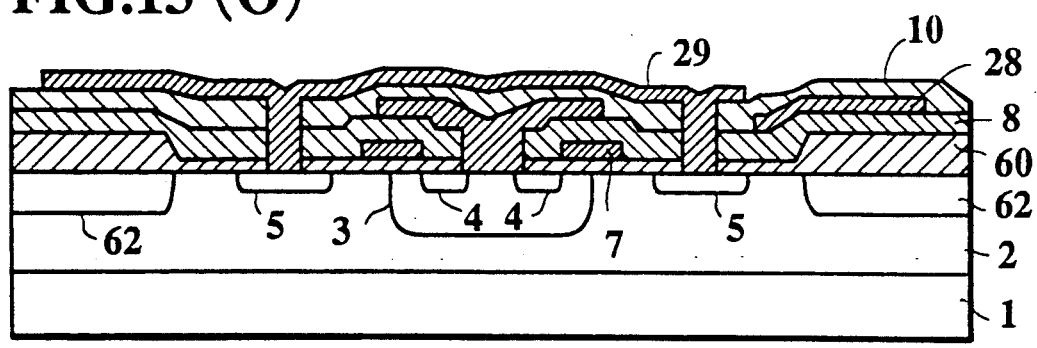
Figure 13:
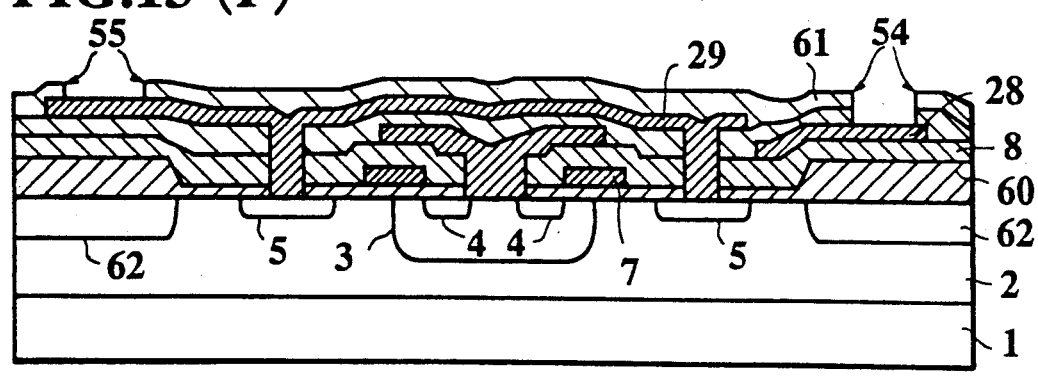

Next, as shown in FIG. 13(0), the second aluminum layer is formed by using a vaporization method, and then the drain electrode 29 and the aluminum gate electrode 56 (not shown) are formed by using a patterning method.

Finally, as shown in FIG. 13(P), the passivation film 61 is formed, and the source pad 54, drain pad 55, and gate pad 57 (not shown) are formed using a photo-lithographic etching method.

Now, some examples of effective applications of the DMOS FET device according to the present invention will be described.

Figure 14:
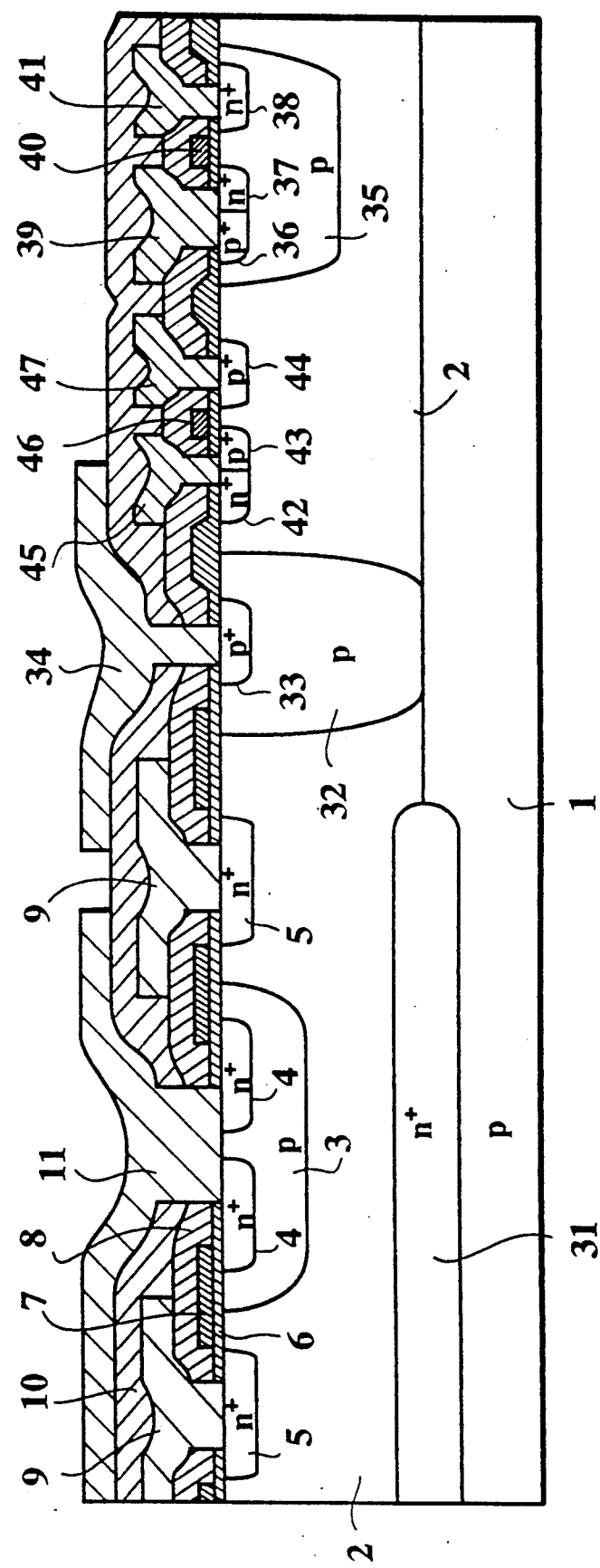
FIG. 14 is a cross sectional view of one embodiment of a power IC incorporating the LDMOSFET device along with a CMOSFET device.

Referring now to FIG. 14, a specific embodiment of a power IC according to the present invention which uses the LDMOS device of the first embodiment described above along with a CMOS will be described.

In this power IC, the n-type epitaxial layer 2 formed on the p-type silicon substrate 1 is divided by an isolation region formed by a p-type diffusion layer 32 reaching to the p-type silicon substrate 1, such that the LDMOS of the first embodiment described above is formed on the left of the isolation region, while a CMOS is formed on the right of the isolation region.

The CMOS comprises a p+-type well contact 36, an n+-type source region 37, and an n+-type drain region 38 are formed inside a p-type well 35 formed inside the n-type epitaxial layer 2, which form a n-channel MOS-FET; an n+-type substrate contact 42, a p+-type source region 43, and a p+-type drain region 44 are formed inside the n-type epitaxial layer 2, which form an p-channel MOSFET; gate electrodes 40 and 46 for the p-type and n-type MOSFETs; source electrodes 39 and 45 for the p-type and n-type MOSFETs; and the drain electrodes 41 and 47 for the p-type and n-type MOSFETs.

Between the n-type epitaxial layer 2 and the p-type silicon substrate 1 below the LDMOS, there is also provided an n+-type buried layer 31 for increasing the base concentration in order to prevent the operation of a parasitic PNP transistor formed by the p-type channel region 3, n-type drain region 2, and p-type silicon substrate 1. Thus, this buried layer 31 does not affect the on resistance of the device at all.

It is to be noted that the similar power IC can be formed by using the LDMOS of the second embodiment described above, in a substantially identical manner.

The LDMOS of the present invention is particularly suitable for this kind of application to the power IC, as its on resistance is reduced to less than a half of that in a conventional LDMOS. A conventionally known power IC formed from an LDMOS and a CMOS, or from an LDMOS and a bipolar IC, has been confined to the application involving small to medium current capacity, because of the high on resistance of the LDMOS. Also, a conventionally known multiple output power IC formed from a plurality of LDMOSs has only 1 to 2 A current capacity, due to the limitation on the device size.

Next, the reduction of the on resistance in the LDMOS device, using appropriate selection of the areas for the drain contact region and the source region will be described in detail.

As already explained above, the on resistance $R_{on}$ can be expressed as a sum of the channel resistance $R_{ch}$ and a parallel connection of the accumulation resistance $R_{ac}$, epitaxial layer spreading resistance $R_{epi}$, and substrate resistance $R_{sub}$, where the $R_{ch}$ depends on the size of the source opening, while the $R_{ac}$, $R_{epi}$ and $R_{sub}$ depend on the size of the drain opening. As a result, when the contribution from $R_{ch}$ and the contribution from $R_{ac}$, $R_{epi}$, and $R_{sub}$ are largely different, the on resistance $R_{on}$ is primarily determined from the larger one of them. This implies that the on resistance $R_{on}$ can be reduced by making one of the source and drain openings which is associated with a larger resistance contribution larger. In general, the values of $R_{ch}$, $R_{ac}$, $R_{epi}$, and $R_{sub}$ are mainly determined from the voltage capacity of the device, and the resistance value of $R_{ch}$ is larger than the resistance value due to $R_{ac}$, $R_{epi}$, and $R_{sub}$ when the voltage capacity of the device is up to 100 V, whereas the resistance value due to $R_{ac}$, $R_{epi}$, and $R_{sub}$ is larger than the resistance value of $R_{ch}$ when the voltage capacity of the device is over 100 V. Thus, for the device of the voltage capacity up to 100 V, the on resistance can be reduced by making the source opening larger, whereas for the device of the voltage capacity over 100 V, the on resistance can be reduced by making the drain opening larger.

Here, it is noted that if an area of a single region is made too large, the uniform flow of the current can be disturbed by the spreading effect, it is preferable to increase a number of openings rather than enlarging a single opening.

Figure 15:
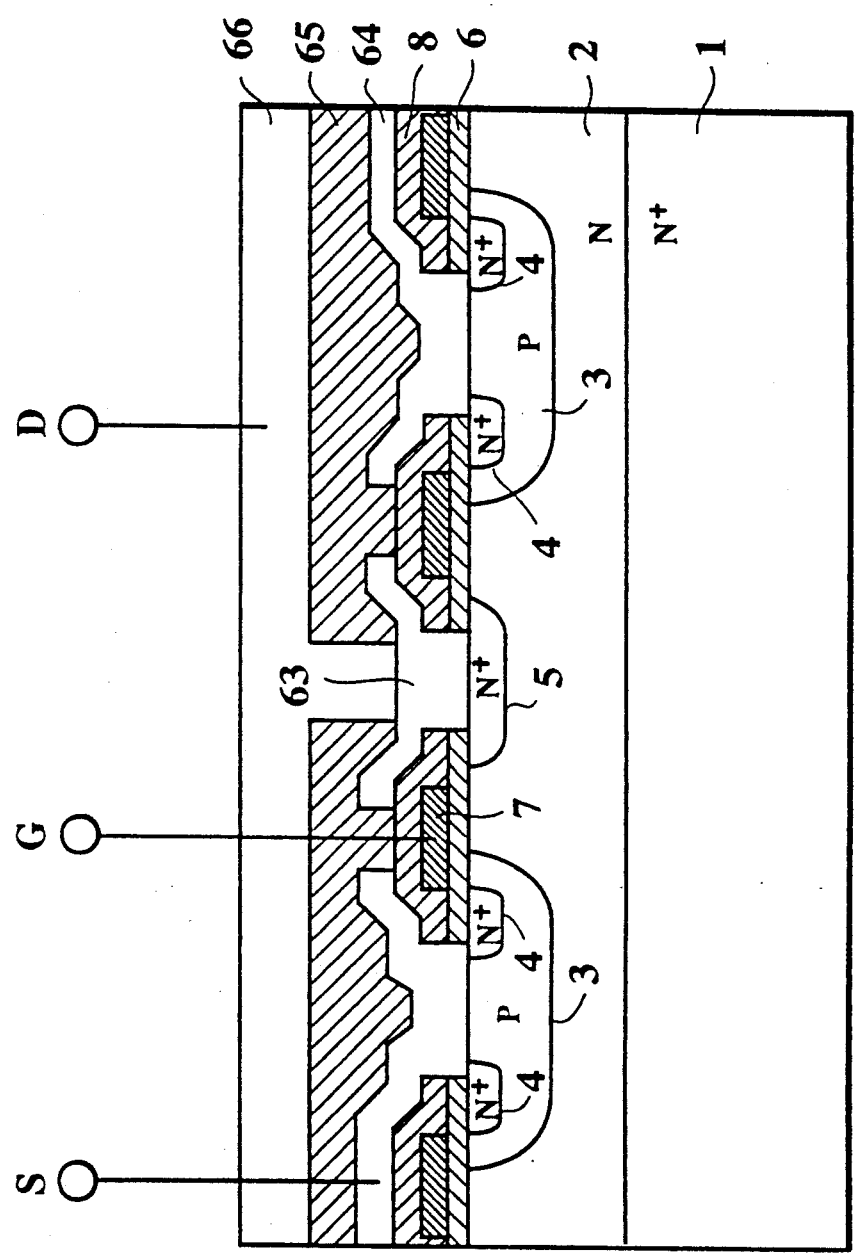
FIG. 15 is a cross sectional view of a third embodiment of a LDMOSFET device according to the present invention.
Figure 16:
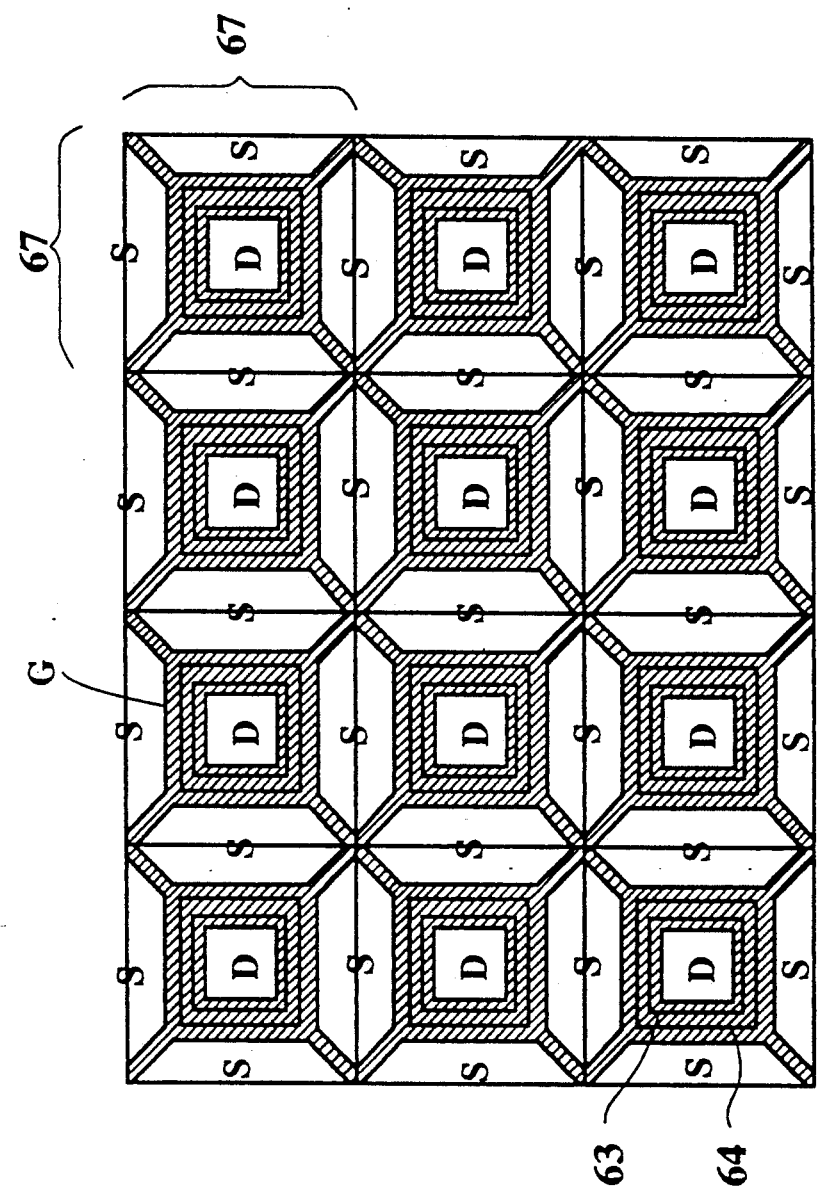
FIG. 16 is a plan view of the LDMOSFET device of FIG. 15, showing its cell structure.

Referring now to FIGS. 15 and 16, a third specific embodiment of the LDMOS device according to the present invention will be described. Here, in order to clearly illustrate the reduction of the on resistance in the LDMOS device using appropriate selection of the areas for the drain contact region and the source region, a case of rectangular cell pattern will be described in this embodiment.

This embodiment differs from the first embodiment of FIG. 6 in that, in this LDMOS of FIG. 15, a source electrode 64 is formed along with the drain electrode 63 from the first aluminum layer, the interlayer insulation film 65 is provided over the drain electrode 63 and the source electrode 64, except on a drain opening directly above the drain electrode 63, and a second aluminum layer 66 connected to the drain electrode 63 is formed over the interlayer insulation film 65, in order to enhance choices of electrode patterning. Here, the silicon substrate 1 is not indispensable element for the LDMOS, but is effective in reducing the resistance further. This silicon substrate 1 can be replaced by a lower resistance buried layer.

This LDMOS has a cell structure in which a plurality of unit cells 67, each of which is formed by a square drain opening D enclosed by four hexagonal source openings S, as shown in FIG. 16, are arranged with a constant pitch in a regular array. In FIG. 16, the drain electrode interlayer insulation film 65 and the second aluminum layer 66 are not depicted.

Now, it is assumed that this LDMOS is for the breakdown voltage equal to 50 V.

In this case, the channel region 3 and the drain region 5 have to be separated by a distance $L_{dc}=2$ μm in order to secure the voltage capability. Also, the specific resistance and the thickness of the n-type epitaxial layer 2 are preferably about 0.4 μ·cm and about 7 μm, respectively, while a channel length of the channel region 3 is preferably over 1.5 μm. Then, with the sheet resistance of the substrate 1 equal to 10 Ω, the gate thickness equal to 500 Å, the gate voltage equal to 5 V, and a threshold voltage equal to 1 V, the resistance values per 1 cm width are $R_{cg}=1\Omega$, $R_{ac}=1\Omega$, $R_{epi}=0.1\Omega$, and $R_{sub}=2$ mΩ. by substituting these values in the equation (2), it follows that:

$$R_{on} = 1 + \cfrac{1}{\cfrac{1}{\frac{1}{1} + \frac{1}{0.1} + \frac{1}{0.002}}} = \frac{1}{511}$$

Here, in reality $R_{epi}$ and $R_{sub}$ become larger than estimated above because of the current spreading effect, but it can still be considered that the first term on the right hand side is significantly larger than the second term on the right hand side.

Thus, in this case, the on resistance can be reduced by making the total source opening area larger than the total drain opening area. This is realized in the LDMOS of FIG. 16 as a total area of the source openings S is made larger than the area of the drain opening D.

In a case the voltage capacity is over 100 V, it is possible that the second term on the right hand side becomes larger than the first term on the right hand side. In such a case, the on resistance can be reduced by exchanging the source openings S and the drain opening D in FIG. 16.

Figure 17:
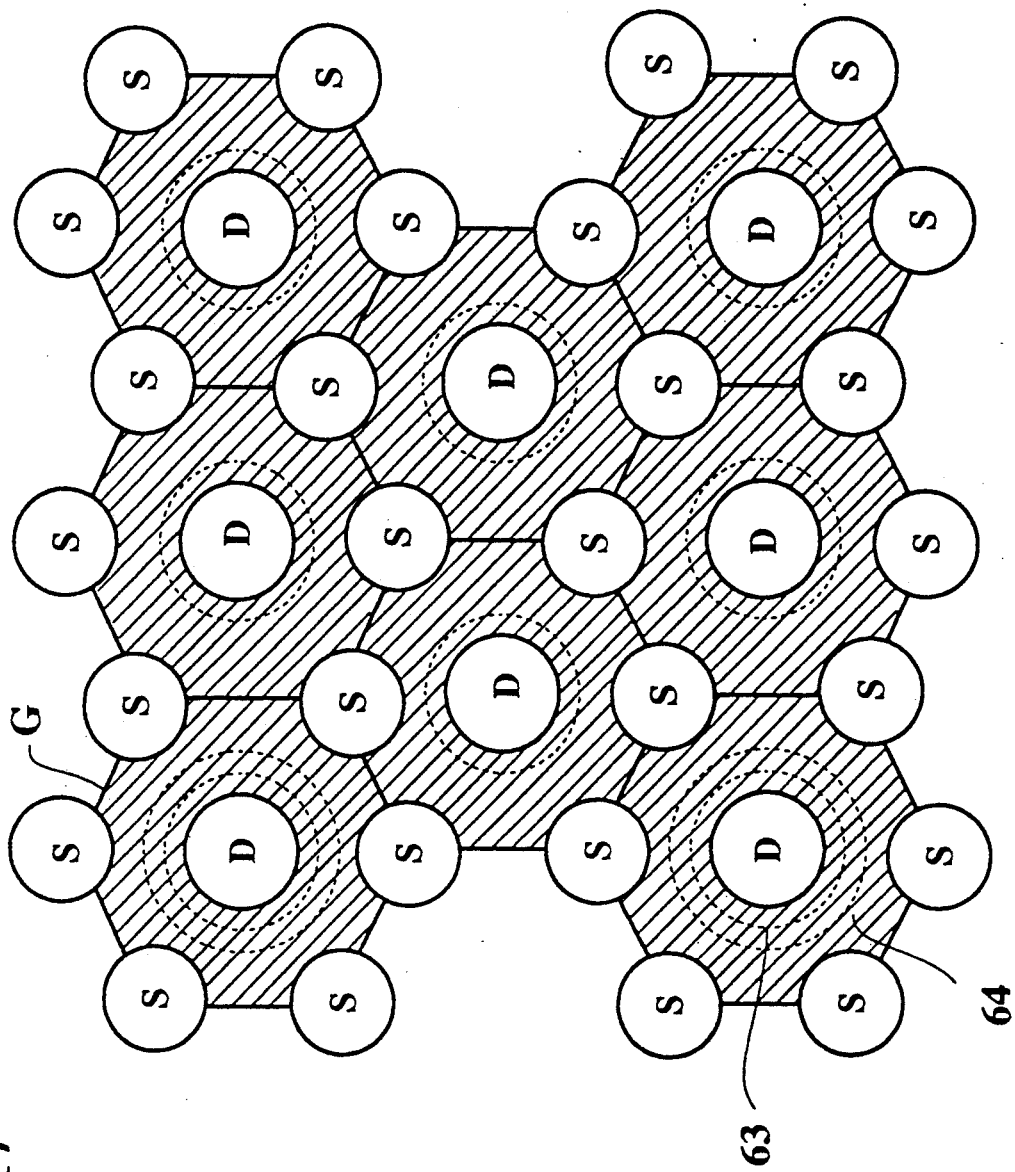
FIG. 17 is a plan view of a fourth embodiment of a LDMOSFET device according to the present invention, showing its cell structure.

Referring now to FIG. 17, a fourth specific embodiment of the LDMOS device according to the present invention will be described.

This embodiment differs from the third embodiment of FIG. 16 in that this LDMOS of FIG. 17 has a so called hexagonal cell structure in which a substrate surface is divided into a plurality of hexagonal unit cells. Here, the total area of the source openings S for each unit cell is made larger than the area of the drain opening D by a ratio of 2:1.

As in the third embodiment above, in a case of high voltage application, the on resistance can be reduced by exchanging the source openings S and the drain opening D in FIG. 17.

Also, in this LDMOS of FIG. 17, because of diffusion windows for the channel region and the source region are in circular shapes, diffusion layers of uniform electrical characteristics are realized. This is advantageous in controlling the breakdown voltage or the threshold voltage.

As described, in the LDMOS according to the present invention, a circular source region, is used, drain contact regions are placed on corners of the cell outer form, and the source and drain electrodes are formed in double layer structure, so that the on resistance can be reduced while retaining the advantage of the LDMOS structure, which enables a realization of an integrated power IC or a multiple output power MOSFET with a large current capacity. Moreover, by making the sizes of the drain and source openings different, the on resistance can be reduced more effectively.

It is to be noted that many modifications and variations of the above embodiments may be made without departing from the novel and advantageous features of the present invention. Accordingly, all such modifications and variations are intended to be included within the scope of the appended claims.

What is claimed is:

1. A lateral DMOS FET device, comprising:
a cell structure formed by a plurality of unit cells, each of said unit cells including:
a source region of a first conduction type formed on one side of a substrate of said first conduction type;
a channel region of a second conduction type formed around the source region;
a plurality of drain contact regions of said first conduction type located around the channel region,
wherein the cell structure is formed in a hexagonal arrangement having hexagonal shaped cells, in which the drain contact regions are located on corners of a hexagonal outer form of each of said unit cells;
a source electrode, formed on said one side of the substrate, for connecting the source regions of the unit cells;
a gate electrode, formed on said one side of the substrate, over the channel regions of the unit cells; and
a drain electrode, formed on said one side of the substrate, for connecting the drain contact regions of the unit cells.

2. The device of claim 1, wherein the source electrode and the drain electrode are in a double layer structure.

3. The device of claim 1, wherein a total area of the drain contact regions and an area of the source region is different in each of said unit cells.

4. A lateral DMOS FET device, comprising:
a cell structure formed by a plurality of unit cells, each of said unit cells including:
a drain contact region of a first conduction type formed on one side of a substrate of said first conduction type;
a channel region of a second conduction type formed around the drain contact region;

a plurality of source regions of said first conduction type located around the channel region, wherein the cell structure is formed in a hexagonal arrangement having hexagonal shaped cells, in which the source regions are located on corners of a hexagonal outer form of each of said unit cells;

a source electrode, formed on said one side of the substrate, for connecting the source regions of the unit cells;

a gate electrode, formed on said one side of the substrate, over the channel regions of the unit cells; and a drain electrode, formed on said one side of the substrate, for connecting the drain contact regions of the unit cells.

5. The device of claim 4, wherein the source electrode and the drain electrode are in a double layer structure.

6. The device of claim 4, wherein a total area of the source regions and an area of the drain contact region is different in each of said unit cells.

7. A lateral DMOS FET device, comprising:
a cell structure formed by a plurality of unit cells, each of said unit cells including:
a source region of a first conduction type formed on one side of a substrate of said first conduction type;
a channel region of a second conduction type formed around the source region;
a plurality of drain contact regions of said first conduction type located around the channel region,
wherein the cell structure is formed in a hexagonal arrangement having hexagonal shaped cells, in which the drain contact regions are located on corners of a hexagonal outer form of each of said unit cells;
a source electrode, formed on said one side of the substrate, for connecting the source regions of the unit cells;
a gate electrode, formed on said one side of the substrate, over the channel regions of the unit cells, the gate electrode having openings which use diffusion windows of the channel and the source regions and which are in a predetermined shape involving more than eight corners; and
a drain electrode, formed on said one side of the substrate, for connecting the drain contact regions of the unit cells.

8. The device of claim 7, wherein said predetermined shape is circular.

9. The device of claim 8, wherein the source electrode and the drain electrode are in a double layer structure.

10. The device of claim 8, wherein a total area of the drain contact regions and an area of the source region is different in each of said unit cells.

11. The device of claim 7, wherein said predetermined shape is polygonal.

12. The device of claim 11, wherein the source electrode and the drain electrode are in a double layer structure.

13. The device of claim 11, wherein a total area of the drain contact regions and an area of the source region is different in each of said unit cells.

14. A lateral DMOS FET device, comprising:
a cell structure formed by a plurality of unit cells, each of said unit cells including:
a drain contact region of a first conduction type formed on one side of a substrate of said first conduction type;
a channel region of a second conduction type formed around the drain contact region;
a plurality of source regions of said first conduction type located around the channel region,
wherein the cell structure is formed in a hexagonal arrangement having hexagonal shaped cells, in which the source regions are located on corners of a hexagonal outer form of each of said unit cells;
a source electrode, formed on said one side of the substrate, for connecting the source regions of the unit cells;
a gate electrode, formed on said one side of the substrate, over the channel regions of the unit cells, the gate electrode having openings which use diffusion windows of the channel and the source regions and which are in a predetermined shape involving more than eight corners; and
a drain electrode, formed on said one side of the substrate for connecting the drain contact regions of the unit cells.

15. The device of claim 14, wherein said predetermined shape is circular.

16. The device of claim 15, wherein the source electrode and the drain electrode are in a double layer structure.

17. The device of claim 15, wherein a total area of the source regions and an area of the drain contact region is different in each of said unit cells.

18. The device of claim 14, wherein said predetermined shape is polygonal.

19. The device of claim 18, wherein the source electrode and the drain electrode are in a double layer structure.

20. The device of claim 18, wherein a total area of the source regions and an area of the drain contact region is different in each of said unit cells.

21. A lateral DMOS FET device, comprising:
a cell structure formed by a plurality of unit cells, each of said unit cells including:
a source region of a first conduction type formed on one side of a substrate of said first conduction type;
a channel region of a second conduction type formed around the source region;
a plurality of drain contact regions of said first conduction type located around the channel region,
wherein the cell structure is formed in a hexagonal arrangement having hexagonal shaped cells, in which the drain contact regions are located on corners of a hexagonal outer form of each of said unit cells;
a source electrode, formed on said one side of the substrate, for connecting the source regions of the unit cells;
a gate electrode, formed on said one side of the substrate, over the channel regions of the unit cells, the gate electrode having openings which use diffusion windows of the channel and the source regions and which are in an approximately circular shape; and
a drain electrode, formed on said one side of the substrate, for connecting the drain contact regions of the unit cells.

22. A lateral DMOS FET device, comprising:
a cell structure formed by a plurality of unit cells, each of said unit cells including:

a drain contact region of a first conduction type formed on one side of a substrate of said first conduction type;

a channel region of a second conduction type formed around the drain contact region;

a plurality of source regions of said first conduction type located around the channel region, wherein the cell structure is formed in a hexagonal arrangement having hexagonal shaped cells, in which the source regions are located on corners of a hexagonal outer form of each of said unit cells;

a source electrode, formed on said one side of the substrate for connecting the source regions of the unit cells;

a gate electrode, formed on said one side of the substrate, over the channel regions of the unit cells, the gate electrode having openings which use diffusion windows of the channel and the source regions and which are in an approximately circular shape; and a drain electrode, formed on said one side of the substrate, for connecting the drain contact regions of the unit cells.

* * * * *